(12) United States Patent
Sobolewski

(10) Patent No.: US 10,677,828 B2
(45) Date of Patent: Jun. 9, 2020

(54) LOW FREQUENCY IMPEDANCE MEASUREMENT WITH SOURCE MEASURE UNITS

(71) Applicant: Keithley Instruments, LLC, Solon, OH (US)

(72) Inventor: Gregory Sobolewski, Seven Hills, OH (US)

(73) Assignee: Keithley Instruments, LLC, Cleveland, OH (US)

( * ) Notice: Subject to any disclaimer, the term of this patent is extended or adjusted under 35 U.S.C. 154(b) by 172 days.

(21) Appl. No.: 15/789,995

(22) Filed: Oct. 21, 2017

(65) Prior Publication Data

US 2018/0059157 A1    Mar. 1, 2018

Related U.S. Application Data

(62) Division of application No. 13/214,693, filed on Aug. 22, 2011, now Pat. No. 9,829,520.

(51) Int. Cl.
*G01R 27/02* (2006.01)
(52) U.S. Cl.
CPC .............. *G01R 27/02* (2013.01); *G01R 27/025* (2013.01)
(58) Field of Classification Search
CPC ................................ G01R 27/02; G01R 27/025
USPC .......................................................... 324/612
See application file for complete search history.

(56) References Cited

U.S. PATENT DOCUMENTS

| | | |
|---|---|---|
| 2005/0237079 A1 | 10/2005 | Tanida et al. |
| 2007/0259256 A1* | 11/2007 | Le Canut .......... H01M 8/04089 429/90 |
| 2008/0068029 A1 | 3/2008 | Tanida et al. |
| 2008/0303538 A1* | 12/2008 | Orr ....................... G01R 15/005 324/707 |
| 2010/0141275 A1* | 6/2010 | Matsushima ........... G06F 3/044 324/678 |
| 2011/0080172 A1* | 4/2011 | Banning-Geertsma ..................... G01V 3/28 324/346 |

FOREIGN PATENT DOCUMENTS

| | | |
|---|---|---|
| JP | H05-099960 | 4/1993 |
| JP | H08-094677 | 4/1996 |
| JP | 2009-186469 | 8/2009 |
| JP | 2010-249749 | 11/2010 |
| JP | 2010-286453 | 12/2010 |
| WO | 2010/150337 | 12/2010 |

* cited by examiner

*Primary Examiner* — Jeff W Natalini
(74) *Attorney, Agent, or Firm* — Miller Nash Graham & Dunn; Andrew J. Harrington

(57) ABSTRACT

A method for measuring the impedance of a DUT having a capacitance of less than 1 pF includes applying a voltage or current signal to the DUT, the voltage or current signal including an AC component having a non-zero frequency of less than 1 kHz; monitoring a current or voltage signal, respectively, through the DUT in response to the voltage or current signal; digitizing the voltage signal and the current signal synchronously; and calculating the impedance from the digitized voltage and current signals.

14 Claims, 3 Drawing Sheets

LOW FREQUENCY IMPEDANCE MEASUREMENT WITH SOURCE MEASURE UNITS

RELATED APPLICATIONS

This application is a divisional of co-pending U.S. patent application Ser. No. 13/214,693, filed Aug. 22, 2011, the disclosure of which is hereby incorporated by reference in its entirety.

TECHNICAL FIELD

This disclosure relates to the measurement of impedances and, in particular, to high impedances at low frequencies.

BACKGROUND

The measurement of very high impedances can present difficulties. This is because the impedances involved are so large that the voltage applied to the device under test (DUT) is exceedingly large and/or the resulting current is exceedingly small. For example, using too high of a voltage can result in device breakdown or even arcing. In the case of capacitances, low frequencies exacerbate the problems, because the impedance is inversely related to the frequency.

Source measure units (SMUs) are well-known in the precision DC electrical measurement field for their ability to very accurately source a DC voltage signal and measure the resulting DC current signal or vice versa. For example, SMUs are available that can selectively source a DC voltage from a microvolt or less to a kilovolt or more and measure a DC current from an attoampere or less to an ampere or more (or vice versa). In DC measurement regimes, this permits the measurement of extremely high impedances (i.e., R=V/I).

SUMMARY OF THE DISCLOSURE

A method for measuring the impedance of a DUT having a capacitance of less than 1 pF includes applying a voltage or current signal to the DUT, the voltage or current signal including an AC component having a non-zero frequency of less than 1 kHz; monitoring a current or voltage signal, respectively, through the DUT in response to the voltage or current signal; digitizing the voltage signal and the current signal synchronously; and calculating the impedance from the digitized voltage and current signals.

DETAILED DESCRIPTION

Figure 1:
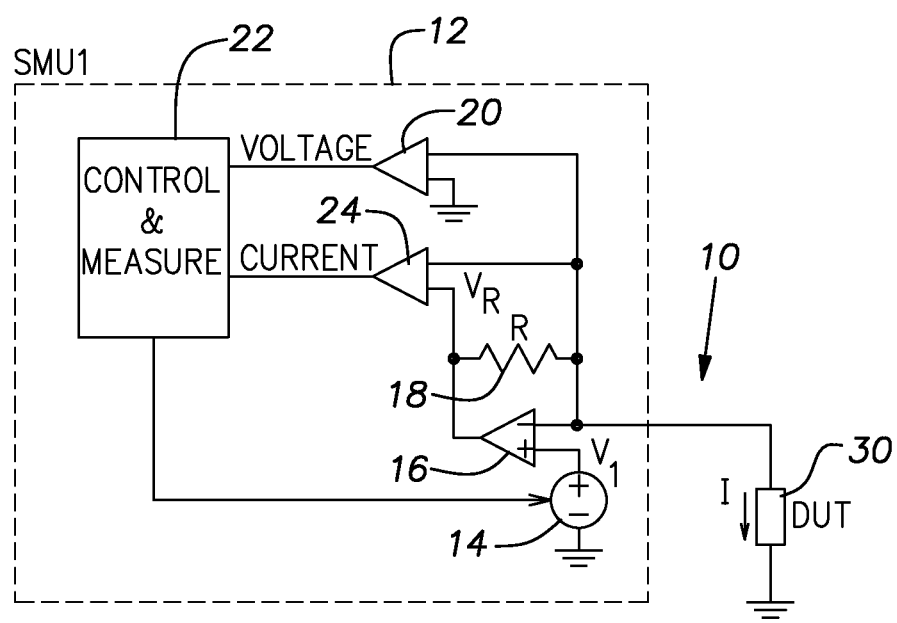
FIG. 1 is a schematic diagram of an example of a measurement configuration for performing an aspect of the invention.

Referring to FIG. 1, a measurement configuration 10 includes an example of an idealized source measure unit (SMU) 12 connected to a device under test (DUT) 30. An adjustable voltage source 14 provides the voltage $V_1$ to the non-inverting input of an operational amplifier 16. The feedback loop provided by the resistor 18 (R) forces the inverting input of the operational amplifier 16 to the value of $V_1$ also. Note that the feedback loop is the source of the current I through the DUT 30 as well. As a result, the voltage drop across the resistor 18 is proportional to the current through the DUT 30 (i.e., $V_R$=IR or I=$V_R$/R).

The buffer amplifier 20 provides a buffered version of the voltage $V_1$ (which is the value of the voltage across the DUT 30) to the control and measurement section 22 and the buffer amplifier 24 provides a buffered version of the voltage $V_R$ as a scaled (by R) version of the current through the DUT 30 to the control and measurement section 22. The control and measurement section 22 also controls the desired value $V_1$ of the adjustable voltage source 14.

The control and measurement section 22 includes the ability to measure the values of the voltage $V_1$ and the current I including digitizing the values. The control and measurement section 22 also controls the desired value $V_1$ of the adjustable voltage source 14.

While essentially a DC device, the SMU 12 does fortuitously include the capability to adjust the value $V_1$ of the adjustable voltage source 14. Within the bandwidth constraints of the feedback loops of the SMU 12, the value of V1 can be varied periodically by the control and measurement section 22 to produce an AC signal. Typically, the bandwidth limits of the SMU 12 is 1 kHz or less. This allows the SMU 12 to source, for example, a corresponding sinusoidal AC voltage signal of 1 kHz or less.

To measure the impedance of a DUT 30 having primarily a small capacitance (e.g., 1 pF or less) at these low frequencies, the periodically varying voltage signal $V_1$ is applied to the DUT 30 and the current signal I through the DUT 30 is monitored. The control and measurement section 22 synchronously digitizes the voltage signal and the current signal in order that the impedance of the DUT 30 may be calculated. This is a complex value that includes, for example, not only the capacitive component but may also include a resistive component typical of a non-ideal capacitive device.

In the case of a 1 kHz frequency, a 1 pF capacitance and a nominally 1 kV voltage signal, the capacitive impedance would be approximately 160 mega Ohms (MΩ) and the current would be on the order of 6 microamps (μA). Considering that the SMU 12 may be capable of measuring attoamps, it can be seen the much lower frequencies and very much higher impedances can be measured without utilizing excessive voltages.

The control and measurement section 22 can advantageously calculate the impedance from the digitized voltage and current using such techniques as discrete Fourier transforms (DFTs) which are often implemented using fast Fourier transform (FFT) algorithms.

Figure 2:
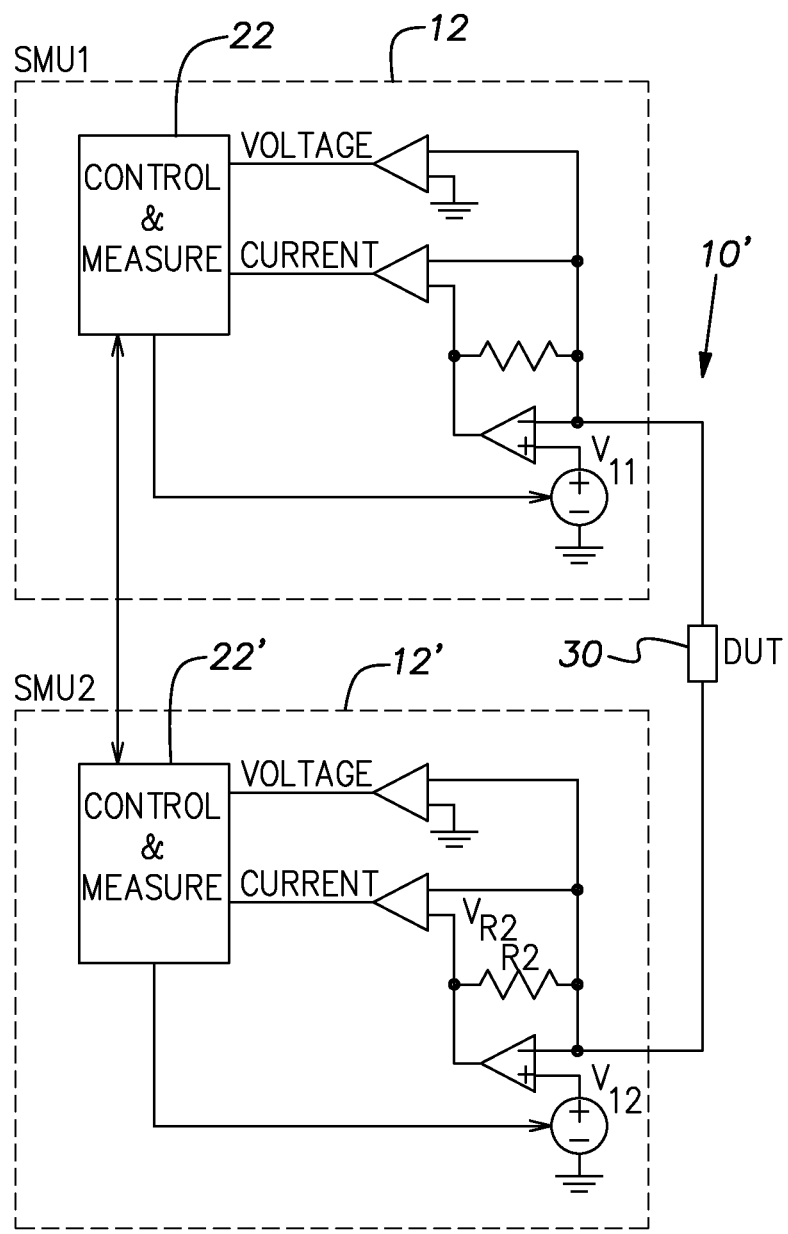
FIG. 2 is a schematic diagram of another example of a measurement configuration for performing another aspect of the invention.

In real-world operation, the measurement configuration 10 may be somewhat compromised by stray impedances in parallel with the DUT 30 (e.g., SMU output impedance, cable leakage, test and fixture impedances). Referring to FIG. 2, improved performance can be obtained with the measurement configuration 10' which uses two SMUs 12, 12'.

The SMU 12 applies an AC voltage component to the DUT 30 while the SMU 12' provides a DC bias voltage signal that the AC component rides on top of. This forces the return of all AC signals flowing through the DUT into the SMU 12'. Therefore, voltage measured across the DUT and current measured by the SMU 10' can be used as an accurate representation of signals resulting from the DUT 30 impedance. The respective control and measurement sections 22, 22' communicate with each other and again, DFTs can be used to make impedance calculations. The voltage across the DUT 30 is $V_{11}$-$V_{12}$ and the current though the DUT 30 is $V_{R2}$/R2.

Figure 3:
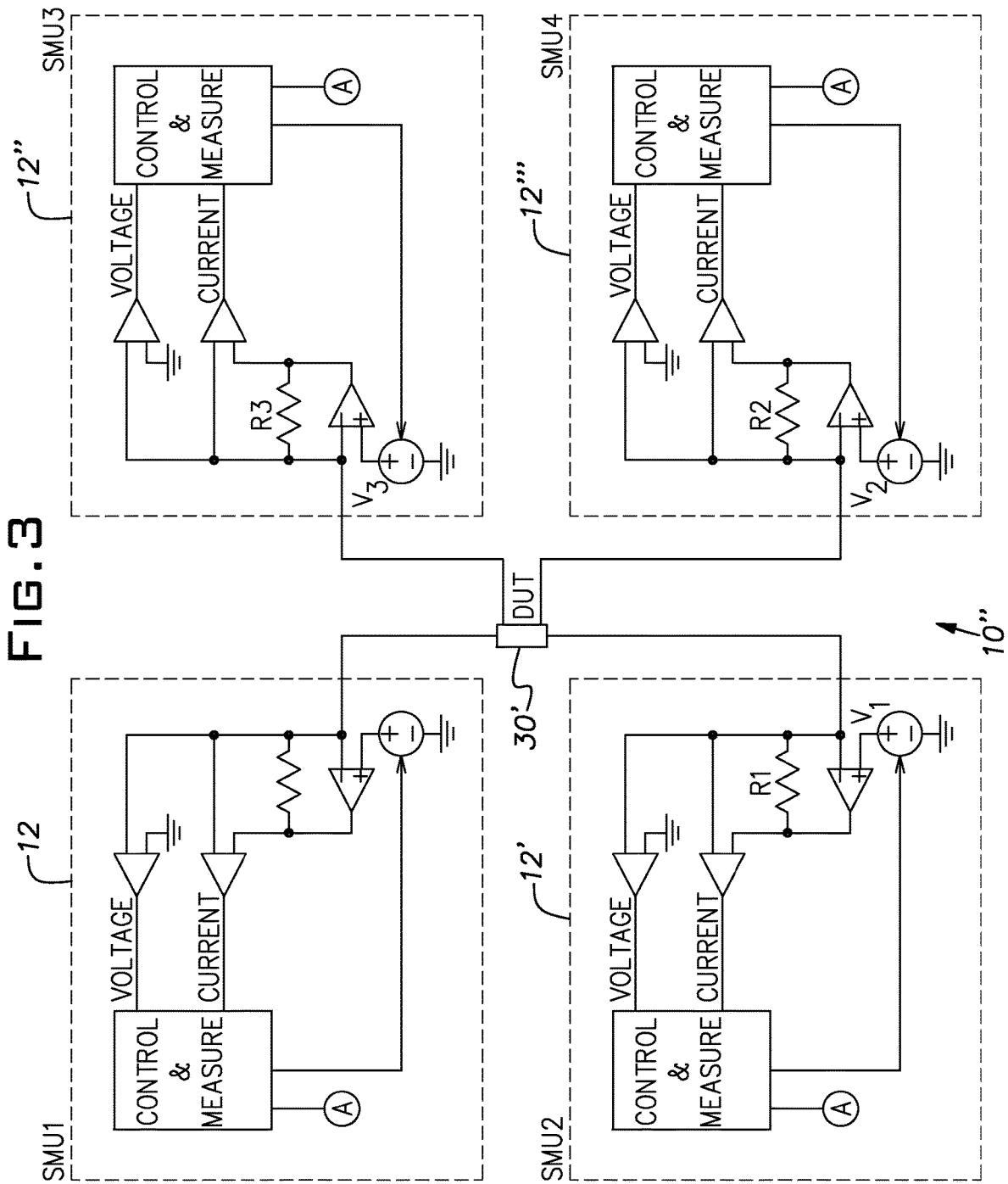
FIG. 3 is a schematic diagram of still another example of a measurement configuration for performing still another aspect of the invention.

The configuration of FIG. 2 can be extended to provide simultaneous multipin capacitance measurements. For example, referring to FIG. 3, the SMU 12 can be used to provide an AC voltage signal component to the DUT 30' while the SMUs 12', 12" and 12''' can each provide a DC bias for a respective test point on the DUT 30' and measure the current through the DUT 30' between the SMU 10 and the respective test point. The respective SMU control and measurement sections are interconnected (A). The respective impedances can then be calculated as above.

It should be noted that because of the duality of voltage and current, instead of voltages being applied and currents measured, currents may be applied and voltages measured to produce a measurement of the impedance of the DUT. SMUs are particularly useful in such applications because they are designed to interchangeably source voltage and measure current or to source current and measure voltage.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

What is claimed is:

1. A method for measuring the impedance of a DUT having a capacitance of less than 1 pF, said method comprising:
   applying a voltage signal produced by a source measure unit to said DUT, said voltage signal sourced by an adjustable DC voltage source in the source measure unit being varied periodically at a non-zero frequency equal to or less than 1 kHz and less than a frequency bandwidth limit of the source measure unit such that said voltage signal includes an AC component having the non-zero frequency;
   monitoring with said source measure unit a current signal through said DUT in response to said voltage signal;
   digitizing said voltage signal and said current signal synchronously; and
   calculating said impedance from said digitized voltage and current signals, wherein the frequency bandwidth limit of the source measure unit is determined by a sensing feedback loop in the source measure unit.

2. The method according to claim 1, wherein said voltage signal is digitized by said source measure unit.

3. The method according to claim 1, wherein said digitizing is performed by said source measure unit.

4. The method according to claim 1, wherein said digitizing comprises digitizing linear representations of said voltage signal and said current signal.

5. The method according to claim 1, wherein said calculating includes FFT or DFT calculations performed by a controller.

6. The method according to claim 5, wherein said controller is within said source measure unit.

7. The method according to claim 1, wherein the measured impedance of the DUT is a complex impedance including a capacitive component and a resistive component.

8. A method for measuring the impedance of a DUT having a capacitance of less than 1 pF, said method comprising:
applying a current signal from a source measure unit through said DUT, said current signal sourced in response to an adjustable DC voltage source in the source measure unit being varied periodically at a non-zero frequency equal to or less than 1 kHz and less than a frequency bandwidth limit of the source measure unit such that said current signal includes an AC component having the non-zero frequency;
monitoring a voltage signal across said DUT with said source measure unit in response to said current signal;
digitizing said voltage signal and said current signal synchronously; and
calculating said impedance from said digitized voltage and current signals, wherein the frequency bandwidth limit of the source measure unit is determined by a sensing feedback loop in the source measure unit.

9. The method according to claim 8, wherein said current signal is digitized by said source measure unit.

10. The method according to claim 8, wherein said digitizing is performed by said source measure unit.

11. The method according to claim 8, wherein said digitizing comprises digitizing linear representations of said voltage signal and said current signal.

12. The method according to claim 8, wherein said calculating includes FFT or DFT calculations performed by a controller.

13. The method according to claim 12, wherein said controller is within said source measure unit.

14. The method according to claim 8, wherein the measured impedance of the DUT is a complex impedance including a capacitive component and a resistive component.

* * * * *